(12) United States Patent
Sawayama et al.

(10) Patent No.: US 8,946,843 B2
(45) Date of Patent: Feb. 3, 2015

(54) SOLID-STATE IMAGE SENSING DEVICE

(75) Inventors: Tadashi Sawayama, Machida (JP); Takehiko Harada, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 485 days.

(21) Appl. No.: 12/912,264

(22) Filed: Oct. 26, 2010

(65) Prior Publication Data
US 2011/0115953 A1    May 19, 2011

(30) Foreign Application Priority Data
Nov. 13, 2009   (JP) .................. 2009-260450

(51) Int. Cl.
*H01L 21/02* (2006.01)
*G02B 5/20* (2006.01)
*H01L 27/146* (2006.01)

(52) U.S. Cl.
CPC .......... *G02B 5/201* (2013.01); *H01L 27/14603* (2013.01); *H01L 27/14621* (2013.01); *H01L 27/14625* (2013.01); *H01L 27/14645* (2013.01)
USPC ...................................................... 257/437

(58) Field of Classification Search
USPC ....................................................... 257/437
See application file for complete search history.

(56) References Cited

U.S. PATENT DOCUMENTS

| | | | |
|---|---|---|---|
| 6,635,912 B2 | 10/2003 | Ohkubo | 257/292 |
| 6,884,651 B2 | 4/2005 | Toyoda et al. | 438/72 |
| 7,816,641 B2 * | 10/2010 | Tay et al. | 250/226 |
| 2005/0122417 A1 | 6/2005 | Suzuki | 348/340 |
| 2008/0079106 A1 * | 4/2008 | Miyagawa et al. | 257/437 |
| 2008/0265353 A1 | 10/2008 | Komoguchi et al. | 257/432 |
| 2009/0045477 A1 | 2/2009 | Narui | 257/432 |
| 2009/0166518 A1 * | 7/2009 | Tay et al. | 250/227.11 |
| 2010/0271524 A1 * | 10/2010 | Venezia et al. | 348/308 |

FOREIGN PATENT DOCUMENTS

| | | |
|---|---|---|
| JP | 2000-196051 A | 7/2000 |
| JP | 2001-352051 A | 12/2001 |
| JP | 2002-083949 A | 3/2002 |
| JP | 2004-221532 A | 8/2004 |
| JP | 2004-228425 A | 8/2004 |
| JP | 2005-142510 A | 6/2005 |
| JP | 2005-252194 A | 9/2005 |
| WO | WO 2007/055141 A | 5/2007 |

* cited by examiner

*Primary Examiner* — Shaun Campbell
(74) *Attorney, Agent, or Firm* — Fitzpatrick, Cella, Harper & Scinto

(57) ABSTRACT

A solid-state image sensing device includes light-receiving regions and a color filter which transmits red light, a color filter which transmits blue light, and a color filter which transmits green light is provided. The color filters are arranged on a one-to-one basis above the light-receiving regions. Above the light-receiving region where the color filter which transmits red or blue light is arranged, a light-transmitting film, an antireflection film, a light-transmitting film, an antireflection film, and a light-transmitting film are arranged, in this order from the light-receiving region, between the light-receiving region and the color filter. Above the light-receiving region where the color filter which transmits green light is arranged, a light-transmitting film, an antireflection film, and a light-transmitting film are arranged, in this order from the light-receiving region, between the light-receiving region and the color filter. The antireflection films are higher in refractive index than the light-transmitting films.

20 Claims, 3 Drawing Sheets

SOLID-STATE IMAGE SENSING DEVICE

BACKGROUND OF THE INVENTION

1. Field of the Invention

The present invention relates to a solid-state image sensing device.

2. Description of the Related Art

In a solid-state image sensing device using a CMOS, an insulation film which covers a light-receiving region is formed from a transparent film so that light can reach the light-receiving region where incident light is converted into an electrical signal. For example, incident light passes through an oxide film having a refractive index of about 1.46 from air having a refractive index of about 1. The incident light enters a light-receiving region made of silicon having a refractive index of about 3 to 5. When light passes through the transparent film, it enters a substance having a high-refractive index from one having a low-refractive index. In accordance with the difference in refractive index, reflection occurs at the interface, decreasing the light incident efficiency in the light-receiving region. In a miniaturized solid-state image sensing device, the decrease in the quantity of light incident in the light-receiving region is a serious problem. A technique disclosed in Japanese Patent Laid-Open No. 2004-228425 increases the incident efficiency in the light-receiving region. For this purpose, a silicon nitride film having an intermediate refractive index between those of a silicon and silicon oxide film is stacked on an oxide film, reducing reflection of light. A technique disclosed in Japanese Patent Laid-Open No. 2004-221532 increases the sensitivity of a solid-state image sensing device. More specifically, an opening is formed in a light-transmitting film immediately above a light-receiving region and is filled with silicon oxide, forming a light guide.

However, the technique disclosed in Japanese Patent Laid-Open No. 2004-228425 cannot satisfactorily increase the transmittance because the same structure is applied to all light-receiving regions without considering the wavelength of incident light. Also, the technique disclosed in Japanese Patent Laid-Open No. 2004-221532 does not consider the wavelength of incident light. An aspect of the present invention, therefore, provides a technique of increasing the transmittance of an insulation film which covers a light-receiving region.

SUMMARY OF THE INVENTION

According to one aspect of the present invention, there is provided a solid-state image sensing device comprising, a plurality of light-receiving regions, and a color filter which transmits red light, a color filter which transmits blue light, and a color filter which transmits green light, wherein the color filter which transmits red light, the color filter which transmits blue light, and the color filter which transmits green light are arranged on a one-to-one basis above the plurality of light-receiving regions, above the light-receiving region where the color filter which transmits red light or the color filter which transmits blue light is arranged, a first light-transmitting film, a first antireflection film, a second light-transmitting film, a second antireflection film, and a third light-transmitting film are arranged, in this order from the light-receiving region, between the light-receiving region and the color filter, and above the light-receiving region where the color filter which transmits green light is arranged, a first light-transmitting film, a first antireflection film, a second light-transmitting film, and a third light-transmitting film are arranged, in this order from the light-receiving region, between the light-receiving region and the color filter which transmits green light, and the first antireflection film and the second antireflection film are higher in refractive index than the first light-transmitting film, the second light-transmitting film, and the third light-transmitting film.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Figure 1:
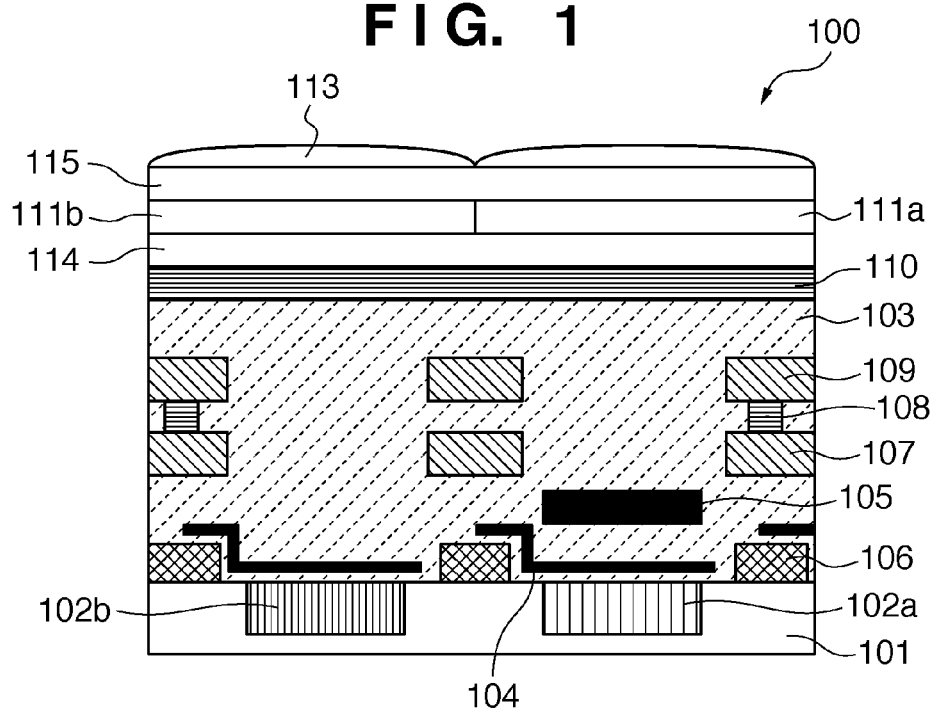
FIG. 1 is a sectional view for explaining an exemplary solid-state image sensing device 100 according to an embodiment of the present invention.

Preferred embodiments of the present invention will be described below with reference to the accompanying drawings. FIG. 1 is a sectional view showing part of an exemplary solid-state image sensing device 100 according to an embodiment of the present invention. In the solid-state image sensing device 100, light-receiving regions 102a and 102b, where incident light is photoelectrically converted, are formed in a semiconductor substrate 101 made of silicon or the like. The light-receiving region 102a is for a blue pixel, and the light-receiving region 102b is for a green pixel. A light-receiving region for a red pixel has the same structure as that of the light-receiving region 102a and thus is not shown. The light-receiving region 102a receives the blue component of light entering the solid-state image sensing device 100 through a color filter 111a which transmits blue light. The light-receiving region 102b receives the green component of light entering the solid-state image sensing device 100 through a color filter 111b which transmits green light. Although not shown, the light-receiving region for the red pixel receives the red component of light entering through a color filter which transmits red light. Gate electrodes 106 are formed on a gate insulation film on the semiconductor substrate 101. Antireflection films 104 are formed above the light-receiving regions 102a and 102b and the gate electrodes 106 with a light-transmitting film 103 disposed above the light-receiving regions and the gate electrodes, and below the antireflection films 104. Over the light-receiving region 102a, an antireflection film 105 is further formed on the antireflection film 104 with the light-transmitting film 103 intervening their between. Although not shown, the antireflection film 105 is similarly formed over the light-receiving region for the red pixel. In contrast, no antireflection film 105 is formed on the antireflection film 104 over the light-receiving region 102b. Wiring layers 107 and 109 are formed above the gate electrodes, and, for example, connected to each other through vias 108. In FIG. 1, two wiring layers are formed, but the number of wiring layers is arbitrary. The wiring layers 107 and 109 are made of, for example, aluminum, and the vias 108 are made of, for example, tungsten. The light-transmitting film 103 may be formed by a plurality of films.

A passivation film 110, a planarizing film 114, the color filters 111a and 111b, a planarizing film 115, and microlenses 113 are formed sequentially on the light-transmitting film 103. The passivation film 110 is, for example, a silicon nitride film, and prevents entrance of water and the like. The color filters 111a and 111b are filters for transmitting only incident light having a specific wavelength. The color filter 111a, which transmits blue light, is formed over the light-receiving region 102a. The color filter 111b, which transmits green light, is formed over the light-receiving region 102b. Although not shown, a color filter which transmits red light is formed over the light-receiving region for the red pixel. The planarizing film 115 is made of, for example, an organic material. The microlenses 113 condense incident light on the light-receiving regions 102a and 102b.

In the embodiment, the antireflection films 104 and 105 are made of a material of higher refractive index than the light-transmitting film 103. For example, the antireflection films 104 and 105 are made of silicon nitride having a refractive index of 2.0, and the light-transmitting film 103 is made of silicon oxide having a refractive index of 1.46.

Figure 2:
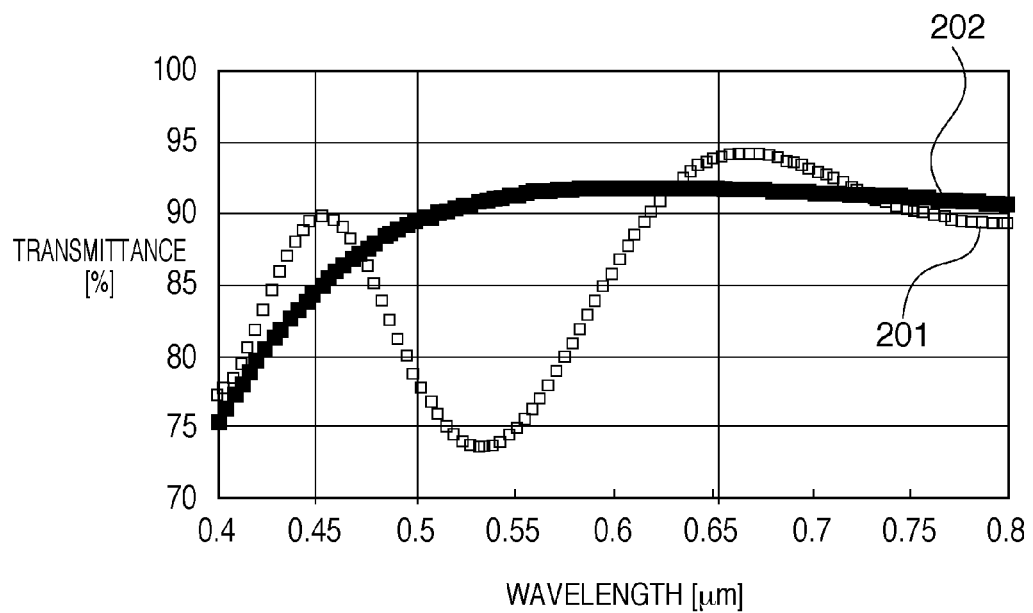
FIG. 2 is a graph for explaining the relationship between the wavelength and transmittance of incident light.

The relationship between the wavelength and transmittance of incident light when one antireflection film higher in refractive index than the surrounding light-transmitting film is formed and when two antireflection films are formed will now be explained with reference to FIG. 2. A graph 201 represents the relationship between the wavelength and transmittance of incident light when two antireflection films are formed. A graph 202 represents the relationship between the wavelength and transmittance of incident light when one antireflection film is formed. The transmittance of incident light is theoretically calculated based on the film thickness and refractive index of each film. When drawing the graphs 201 and 202, a silicon oxide film having a refractive index of 1.46 was used as the light-transmitting film, and a silicon nitride film having a refractive index of 2.0 was used as the antireflection film. Further, when drawing the graph 201, the thickness of each film was 15 nm for a light-transmitting film between the substrate and the first antireflection film, 50 nm for the first antireflection film, 180 nm for a light-transmitting film between the first and second antireflection films, and 200 nm for the second antireflection film. When drawing the graph 202, the thickness of each film was 15 nm for a light-transmitting film between the substrate and the first antireflection film, 50 nm for the first antireflection film, and 380 nm for a light-transmitting film on the first antireflection film.

From a comparison between the graphs 201 and 202, the transmittance of blue incident light having a wavelength of 450 nm and that of red incident light having a wavelength of 650 become higher when two antireflection films are formed. However, the transmittance of green incident light having a wavelength of 500 nm becomes higher when one antireflection film is formed. For this reason, in the solid-state image sensing device 100 of the embodiment, the two antireflection films 104 and 105 are formed over the light-receiving region 102a for the blue pixel and the light-receiving region (not shown) for the red pixel, and one antireflection film 104 is formed over the light-receiving region 102b for the green pixel. When the antireflection films 104 and 105 are made of silicon nitride and the light-transmitting film is made of silicon oxide, the thickness of the antireflection film 105 can be set to 180 nm (inclusive) to 220 nm (inclusive). The thickness of the light-transmitting film between the antireflection films 104 and 105 can be set to 160 nm (inclusive) to 200 nm (inclusive).

Figure 3A:
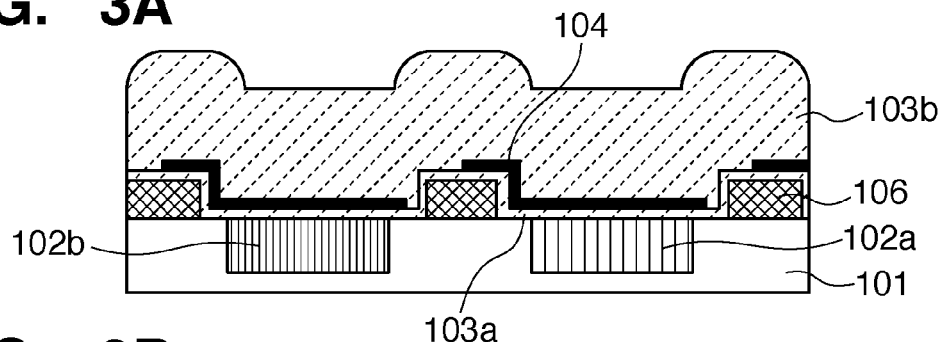
FIGS. 3A to 3D are sectional views for explaining an exemplary method of manufacturing the solid-state image sensing device 100 according to the embodiment of the present invention.

Next, an exemplary manufacturing method of the solid-state image sensing device 100 will be described with reference to FIGS. 3A to 3D. As shown in FIG. 3A, light-receiving regions 102a and 102b including a photodiode and the like are formed in a semiconductor substrate 101. It suffices to form the light-receiving regions 102a and 102b using an existing method. The gate insulation film and gate electrode 106 of each transistor are formed on the semiconductor substrate 101. A light-transmitting film 103a (a first light-transmitting film) such as a silicon oxide film is formed above the light-receiving regions 102a and 102b and the gate electrode 106. An antireflection film 104 such as a silicon nitride film is formed on the light-transmitting film 103a. The antireflection film 104 is formed by etching so as to cover the light-receiving regions 102a and 102b and lie on part of the gate electrode 106. The antireflection film 104 has different film thicknesses in accordance with the corresponding light-receiving regions 102a and 102b. The thickness of the antireflection film 104 can be adjusted by etching. The antireflection film 104 may have the same film thickness over the light-receiving regions 102a and 102b. Further, a light-transmitting film 103b (a second light-transmitting film) such as a silicon oxide film is formed on the resultant structure.

Figure 3B:
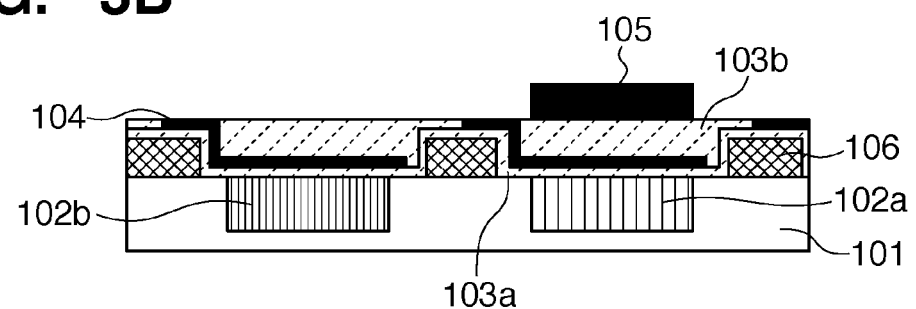

Subsequently, as shown in FIG. 3B, the light-transmitting film 103b is polished by chemical mechanical polishing (CMP) or the like until it has a target film thickness. As described above, the thickness of the light-transmitting film 103b can be set to 160 nm (inclusive) to 200 nm (inclusive) over the light-receiving region. The light-transmitting film 103b is planarized to have a flat upper surface. An antireflection film 105 such as a silicon nitride film is formed on the light-transmitting film 103b using chemical vapor deposition (CVD) or the like. Conditions to form the antireflection film 105 are, for example, a set temperature of 400 degree C., a pressure of 4.5 Torr, an RF power of 560 W, an SiH4 flow rate of 215 sccm, an NH3 flow rate of 70 sccm, and an N2 flow rate of 3,000 sccm. Under these conditions, the antireflection film 105 is formed in 3 sec to have a film thickness of 200 nm. The antireflection film 105 is etched, removing it from the green light-receiving region 102b while leaving it in the blue or red light-receiving region 102a. The planar shape of the antireflection film 105 is a shape corresponding to the light-receiving region, for example, a rectangular shape. Since the antireflection film 105 is formed on the flat light-transmitting film 103b, it has a uniform film thickness, that is, flat upper and lower surfaces.

Figure 3C:
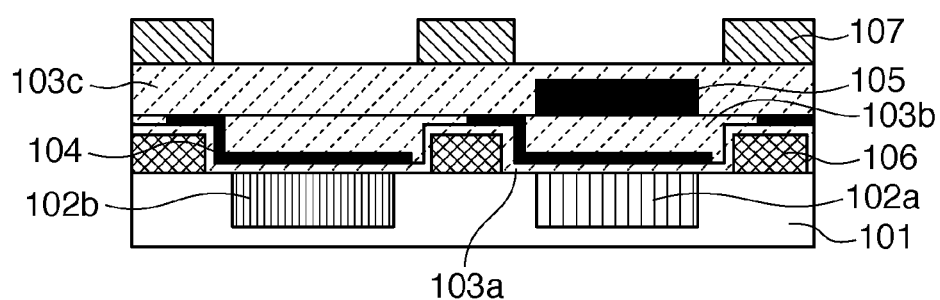

Then, as shown in FIG. 3C, a light-transmitting film 103c (third light-transmitting film) such as a silicon oxide film is deposited to cover the antireflection film 105. The light-transmitting film 103c is planarized by CMP. A resist is coated and exposed to etch away the light-transmitting film 103c, forming a contact hole. After a diffusion protector is formed from Ti, TiN, or the like to suppress diffusion of tungsten, the contact hole is filled with tungsten or the like, forming a contact (not shown). A wiring layer is formed from aluminum or the like on the planarized light-transmitting film 103c by physical vapor deposition (PVD). The wiring layer is exposed and etched, forming a wiring layer 107.

Figure 3D:
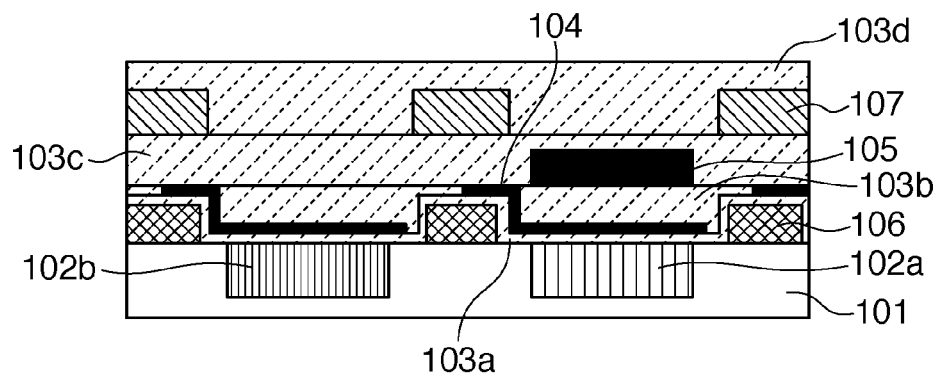

Thereafter, as shown in FIG. 3D, a light-transmitting film 103d such as a silicon oxide film is deposited and planarized by CMP. A resist is coated and exposed to etch away the light-transmitting film 103d, forming a via hole. After a diffusion protector is formed from Ti, TiN, or the like to suppress diffusion of tungsten, the via hole is filled with tungsten or the like, forming a via 108. Tungsten except for the via 108 is removed by CMP. Thereafter, a wiring layer 109 is formed from aluminum or the like. A light-transmitting film such as a silicon oxide film is formed on the wiring layer 109, and planarized by CMP. Then, a passivation film 110 such as a silicon nitride film, and a planarizing film 114 such as an organic material film are formed.

As shown in FIG. 1, color filters 111a and 111b are formed. For example, a resist is coated to a formed color filter, and exposed and etched to remove an unnecessary portion, forming a color filter of each color. Further, a planarizing film 115 and microlenses 113 are formed on the color filters 111a and 111b.

In the solid-state image sensing device 100 according to the embodiment, two antireflection films are formed over light-receiving regions corresponding to blue and red color filters, and one antireflection film is formed over a light-receiving region corresponding to a green color filter. This increases the transmittance of the insulation film which covers the light-receiving regions.

In the embodiment, the antireflection film 104 may not lie on the gate electrode 106. However, when the end of the antireflection film 104 lies on the gate electrode 106, this can reduce damage to the light-receiving region in etching for forming the antireflection film 104.

Another Embodiment

Figure 4:
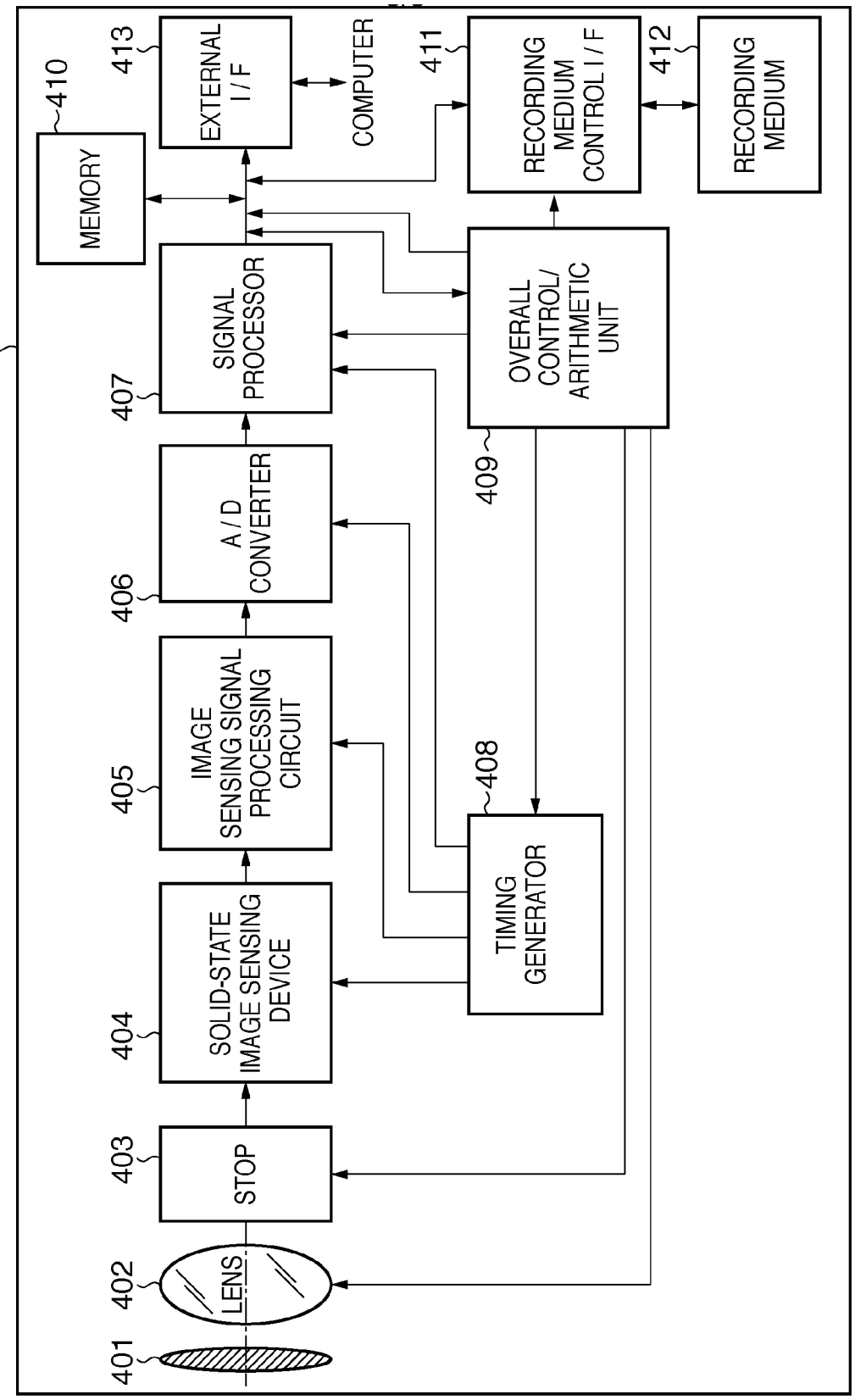
FIG. 4 is an exemplary block diagram showing the schematic arrangement of an image sensing apparatus according to another embodiment of the present invention.

FIG. 4 is an exemplary block diagram showing the schematic arrangement of an image sensing apparatus (camera) according to a preferred embodiment of the present invention. An image sensing apparatus 400 includes a solid-state image sensing device 404 typified by the solid-state image sensing element of the above-described embodiment.

A lens 402 forms the optical image of an object on the image sensing surface of the solid-state image sensing device 404. A barrier 401 serving a protection function for the lens 402 and a main switch is arranged in front of the lens 402. A stop 403 can be arranged for the lens 402 to adjust the quantity of light passing through the stop 403. An image sensing signal processing circuit 405 performs various processes, such as correction and clamping, for image sensing signals output from the solid-state image sensing device 404 using a plurality of channels. An A/D converter 406 A/D-converts the image sensing signals output from the image sensing signal processing circuit 405 using a plurality of channels. A signal processor 407 performs a variety of processes, such as correction and data compression, for the image data output from the A/D converter 406. The solid-state image sensing device 404, the image sensing signal processing circuit 405, the A/D converter 406, and the signal processor 407 operate in accordance with timing signals generated by a timing generator 408.

The blocks 405 to 408 may be formed on the same chip as that of the solid-state image sensing device 404. An overall control/arithmetic unit 409 controls the respective blocks of the image sensing apparatus 400. The image sensing apparatus 400 further includes a memory 410 for temporarily storing image data, and a recording medium control interface (I/F) 411 for recording or reading out an image on or from a recording medium. A recording medium 412 includes a semiconductor memory or the like and is detachable. The image sensing apparatus 400 may include an external interface (I/F) 413 for communicating with an external computer or the like.

The operation of the image sensing apparatus 400 shown in FIG. 4 will now be explained. In response to opening the barrier 401, the main power supply, a power supply for the control system, and a power supply for the image sensing system circuit including the A/D converter 406 are turned on sequentially. To control the exposure, the overall control/arithmetic unit 409 opens the stop 403. A signal output from the solid-state image sensing device 404 is provided to the A/D converter 406 through the image sensing signal processing circuit 405. The A/D converter 406 A/D-converts the signal, and outputs it to the signal processor 407. The signal processor 407 processes the data, and provides it to the overall control/arithmetic unit 409. The overall control/arithmetic unit 409 performs a calculation to determine an exposure. The overall control/arithmetic unit 409 controls the stop 403 based on the determined exposure.

Then, the overall control/arithmetic unit 409 extracts a high-frequency component from the signal which has been output from the solid-state image sensing device 404 and processed by the signal processor 407. The overall control/arithmetic unit 409 calculates the distance to the object based on the high-frequency component. The overall control/arithmetic unit 409 drives the lens 402 and determines whether the object is in focus. If the overall control/arithmetic unit 409 determines that the object is out of focus, it drives the lens 402 again and calculates the distance.

After confirming an in-focus state, actual exposure starts. After the end of exposure, the image sensing signal processing circuit 405 performs correction and the like for an image sensing signal output from the solid-state image sensing device 404. The A/D converter 406 A/D-converts the processed signal, and the signal processor 407 processes the data. The overall control/arithmetic unit 409 accumulates, in the memory 410, the image data processed by the signal processor 407.

Image data accumulated in the memory 410 are recorded on the recording medium 412 via the recording medium control I/F 411 under the control of the overall control/arithmetic unit 409. The image data can be provided to a computer or the like via the external I/F 413, and processed.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-260450, filed Nov. 13, 2009, which is hereby incorporated by reference herein in its entirety.

What is claimed is:

1. A solid-state image sensing device comprising:
   a light-receiving region;
   a gate electrode adjacent to the light-receiving region;
   a first light-transmitting film arranged above the light-receiving region and the gate electrode;

a first antireflection film arranged directly over the light-receiving region and the gate electrode via the first light-transmitting film, the first antireflection film including different material from the first light-transmitting film;
a second light-transmitting film arranged above the first antireflection film; and
a second antireflection film arranged on an upper face of the second light-transmitting film and over the light-receiving region, the second antireflection film including different material from the second light-transmitting film,
wherein the first antireflection film includes a portion extending beyond a position under an edge of the second antireflection film.

2. A solid-state image sensing device comprising:
a light-receiving region;
a gate electrode adjacent to the light-receiving region;
a first silicon oxide film arranged above the light-receiving region and the gate electrode;
a first silicon nitride film arranged directly over the light-receiving region and the gate electrode via the first silicon oxide film;
a second silicon oxide film arranged above the first silicon nitride film; and
a second silicon nitride film arranged on an upper face of the second silicon oxide film and over the light-receiving region,
wherein the first silicon nitride film includes a portion extending beyond a position under an edge of the second silicon nitride film.

3. The device according to claim 1, wherein the second antireflection film includes a lower face which is located above the light-receiving region and which is in contact with an upper face of the second light-transmitting film.

4. The device according to claim 1, wherein the first antireflection film includes an upper face which is located above the gate electrode and which is located on the same level as a lower face of the second antireflection film.

5. The device according to claim 1, further comprising a third light-transmitting film arranged above the second antireflection film, and having a contact hole.

6. The device according to claim 1, wherein the second light-transmitting film includes an upper face which is located above the light-receiving region and which is substantially parallel to a lower face of the second light-transmitting film.

7. A camera comprising:
the solid-state image sensing device according to claim 1, and
a signal processor which processes a signal obtained by the solid-state image sensing device.

8. The device according to claim 2, wherein the second silicon nitride film includes a lower face which is located above the light-receiving region and which is in contact with an upper face of the second silicon oxide film.

9. The device according to claim 2, wherein the first silicon nitride film includes an upper face which is located above the gate electrode and which is located on the same level as a lower face of the second silicon nitride film.

10. The device according to claim 2, further comprising a third silicon oxide film arranged above the second silicon nitride film, and having a contact hole.

11. The device according to claim 2, wherein the second silicon oxide film includes an upper face which is located above the light-receiving region and which is substantially parallel to a lower face of the second silicon oxide film.

12. A camera comprising:
the solid-state image sensing device according to claim 2, and
a signal processor which processes a signal obtained by the solid-state image sensing device.

13. A solid-state image sensing device comprising:
a light-receiving region;
a gate electrode;
a plurality of wiring layers;
a first silicon oxide film disposed on the light-receiving region and the gate electrode;
a first silicon nitride film disposed on the first silicon oxide film and arranged above the light-receiving region and the gate electrode;
a second silicon oxide film, having a planarized surface located above the light-receiving region, disposed on the first silicon nitride film; and
a second silicon nitride film disposed on the planarized surface of the second silicon oxide film, and below a lowermost wiring layer of the plurality of wiring layers,
wherein the first silicon nitride film includes a portion extending beyond a position under an edge of the second silicon nitride film.

14. The device according to claim 13, further comprising:
a third silicon oxide film disposed on the second silicon nitride film and a portion of the planarized surface of second silicon oxide not covered by the second silicon nitride film;
a third silicon nitride layer disposed on the wiring layer and located above the light-receiving region;
a color filter disposed on the third silicon nitride layer and located above the light-receiving region; and
a microlens disposed on the color filter and located above the light-receiving region.

15. The device according to claim 13, further comprising a planarizing film disposed between the color filter and the microlens.

16. A camera comprising:
the solid-state image sensing device according to claim 13, and
a signal processor which processes a signal obtained by the solid-state image sensing device.

17. The device according to claim 1, further comprising a plurality of wiring layers,
wherein the first light-transmitting film, the first antireflection film, the second light-transmitting film, and the second antireflection film are arranged below a lowermost wiring layer of the plurality of wiring layers.

18. The device according to claim 1, wherein the first antireflection film covers an edge of the light-receiving region.

19. The device according to claim 2, further comprising a plurality of wiring layers,
wherein the first silicon oxide film, the first silicon nitride film, the second silicon oxide film, and the second silicon nitride film are arranged below a lowermost wiring layer of the plurality of wiring layers.

20. The device according to claim 2, wherein the first antireflection film covers an edge of the light-receiving region.

* * * * *